(12) United States Patent
Williams et al.

(10) Patent No.: US 8,024,140 B2
(45) Date of Patent: Sep. 20, 2011

(54) WAVEFORM ANOMOLY DETECTION AND NOTIFICATION SYSTEMS AND METHODS

(75) Inventors: Michael Williams, Wilbraham, MA (US); Thomas Zych, Springfield, MA (US)

(73) Assignee: Amherst Systems Associates, Inc., Amherst, MA (US)

( * ) Notice: Subject to any disclaimer, the term of this patent is extended or adjusted under 35 U.S.C. 154(b) by 413 days.

(21) Appl. No.: 12/195,916

(22) Filed: Aug. 21, 2008

(65) Prior Publication Data

US 2009/0055111 A1 Feb. 26, 2009

Related U.S. Application Data

(60) Provisional application No. 60/965,885, filed on Aug. 23, 2007.

(51) Int. Cl.
*G01R 13/00* (2006.01)
*G06F 11/26* (2006.01)
(52) U.S. Cl. .............. 702/66; 702/67; 702/69; 324/512
(58) Field of Classification Search .................. 702/66, 702/58, 59, 67, 69
See application file for complete search history.

(56) References Cited

U.S. PATENT DOCUMENTS

| | | |
|---|---|---|
| 3,725,785 A | 4/1973 | Barrot et al. |
| 4,350,953 A | 9/1982 | Best et al. |
| 4,455,613 A | 6/1984 | Shoemaker |
| 4,540,938 A | 9/1985 | Bruce |
| 4,719,416 A | 1/1988 | Desautels |
| 4,727,288 A | 2/1988 | Nakatsugawa et al. |
| 4,743,844 A | 5/1988 | Odenheimer et al. |
| 4,843,309 A | 6/1989 | Kareem et al. |
| 4,908,784 A | 3/1990 | Box et al. |
| 5,003,248 A | 3/1991 | Johnson |
| 5,128,607 A | 7/1992 | Clark et al. |
| 5,180,971 A | 1/1993 | Montijo |
| 5,191,336 A | 3/1993 | Stephenson |
| 5,204,678 A | 4/1993 | Foley |
| 5,233,545 A | 8/1993 | Ho et al. |
| 5,260,670 A | 11/1993 | Ainsworth et al. |
| 5,262,698 A | 11/1993 | Dunham |
| 5,262,714 A | 11/1993 | Friedman |
| 5,276,629 A | 1/1994 | Reynolds |
| 5,343,405 A | 8/1994 | Kucera et al. |
| 5,352,976 A | 10/1994 | Walker et al. |
| 5,355,327 A | 10/1994 | Stent et al. |
| 5,400,261 A | 3/1995 | Reynolds |
| 5,491,792 A | 2/1996 | Grisham et al. |
| 5,495,168 A | 2/1996 | de Vries |

(Continued)

FOREIGN PATENT DOCUMENTS

EP 0025477 A2 3/1981

(Continued)

OTHER PUBLICATIONS

PCT Search Report, PCT/US2008/073858, Dec. 5, 2008, pp. 15.

*Primary Examiner* — Hal Wachsman

(74) *Attorney, Agent, or Firm* — Cantor Colburn LLP

(57) ABSTRACT

Systems and methods to automatically detect anomalies in waveforms. In addition, the systems and methods alert a human operator of the anomaly and provide suggestions as to the cause of the problem and/or possible solutions to the problem.

35 Claims, 18 Drawing Sheets

U.S. PATENT DOCUMENTS

| | | | |
|---|---|---|---|
| 5,508,605 | A | 4/1996 | Lo et al. |
| 5,528,134 | A | 6/1996 | Davis et al. |
| 5,646,955 | A | 7/1997 | Tozun et al. |
| 5,764,524 | A | 6/1998 | Andersson et al. |
| 5,793,642 | A | 8/1998 | Frisch et al. |
| 5,828,983 | A | 10/1998 | Lombardi |
| 5,841,286 | A | 11/1998 | Stoops |
| 6,137,283 | A | 10/2000 | Williams et al. |
| 6,263,290 | B1 | 7/2001 | Williams et al. |
| 6,421,619 | B1 * | 7/2002 | Daniels et al. ............ 702/66 |
| 6,529,842 | B1 | 3/2003 | Williams et al. |
| 6,571,185 | B1 * | 5/2003 | Gauland et al. ............ 702/68 |
| 7,480,839 | B2 * | 1/2009 | Smith et al. ............ 714/715 |
| 2004/0102879 | A1 | 5/2004 | Raichle et al. |
| 2004/0102910 | A1 * | 5/2004 | Letts ............ 702/67 |
| 2004/0176921 | A1 * | 9/2004 | Lacy et al. ............ 702/78 |
| 2006/0212239 | A1 * | 9/2006 | Letts et al. ............ 702/66 |
| 2007/0038397 | A1 | 2/2007 | Rule et al. |
| 2008/0147342 | A1 | 6/2008 | Heuser et al. |

FOREIGN PATENT DOCUMENTS

| | | |
|---|---|---|
| EP | 0561169 A2 | 9/1993 |
| EP | 0543139 B1 | 10/1997 |
| EP | 1359427 A1 | 5/2003 |
| WO | 03044543 A2 | 5/2003 |

* cited by examiner

US 8,024,140 B2

WAVEFORM ANOMOLY DETECTION AND NOTIFICATION SYSTEMS AND METHODS

PRIORITY CLAIM

This application claims priority under 35 U.S.C. §119 to U.S. Provision Application Ser. No. 60/965,885, entitled Waveform Anomaly Detection and Notification Methods and Devices filed Aug. 23, 2007, which is hereby incorporated by reference in its entirety.

BACKGROUND

This invention relates generally to systems and methods for detecting anomalies and, more particularly, to detecting anomalies in waveforms produced by electrical circuits.

Electronic circuits typically need to be tested in both the design and production phases. At present, there exist several ways to test various portions of such circuits, the most prevalent being through the use of an oscilloscope.

The operation of an oscilloscope provides a time-based snapshot of the operation of a portion of a circuit of interest. For example, an oscilloscope may provide a real-time view of the voltage level in a particular portion of a circuit over a brief (e.g., over one period) time interval. One particular waveform that an oscilloscope may be used to analyze is a clock signal. The oscilloscope will typically show the clock signal (or any other type of signal, such as a data signal) in a Voltage vs. Time (VvT) format.

As described in U.S. Pat. No. 6,263,290 which is hereby incorporated by reference in its entirety, one particularly effective way to analyze a clock signal is to receive a series of voltages sampled from an input clock signal and interpolate between these samples in order to form a time tag list, using interpolations that are optimized for time interval measurement and analysis. The time tag list accurately represents the times at which particular events of interest occur, and is used to generate displays and results analysis such as adjacent clock cycle jitter and accurate differential triggering and analysis or any other type of data signal related display that may be desired.

One drawback of the testing methods is that the detection of anomalies in the waveforms being analyzed requires highly sophisticated and trained human oscilloscope operators. One additional drawback is that oscilloscopes may require additional software to measure period or frequency over many periods.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

SUMMARY

Figure 1:
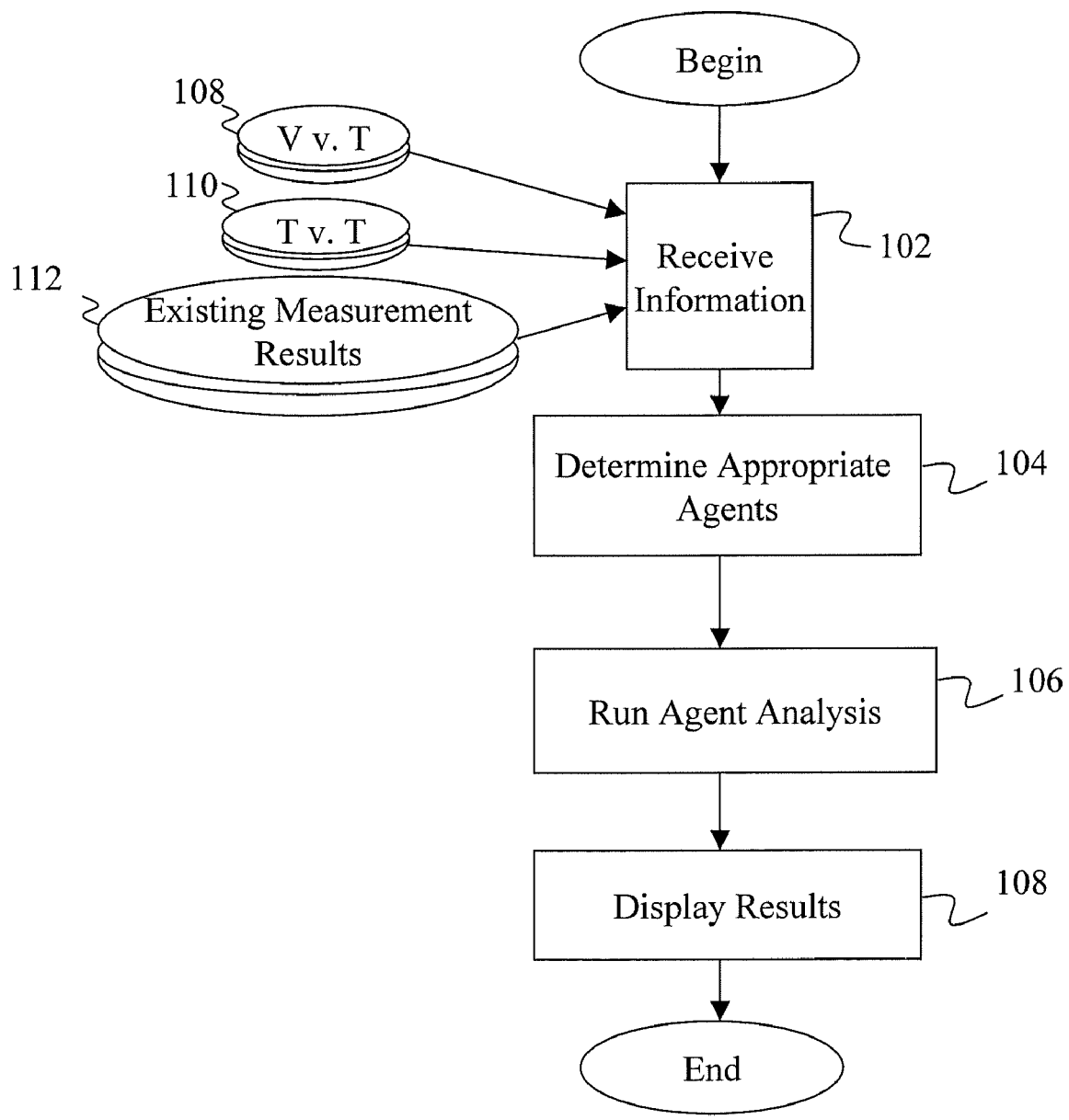
FIG. 1 is a data flow that depicts one embodiment of a method according to the present invention.

In one embodiment, the present invention relates to systems and methods that may be used to detect anomalies in waveforms. The system may detect an anomaly automatically and without user intervention. In addition, the systems and methods of the present invention may, in some embodiments, alert a human operator of the anomaly and, in some embodiments, may provide suggestions as to the cause of the problem and/or possible solutions to the problem.

One embodiment of the present invention is directed to a method for detecting waveform anomalies in an electrical waveform, the electrical waveform resulting from analysis of one more. The method of this embodiment includes receiving input information describing the electrical waveform, the input information including one or more data types; analyzing the input information to determine the data types present in the input information; creating an instance of one or more agents having data type input requirements that are met by the data types present in the input information; analyzing the input information with one or more or the created agents; and notifying a user in the event that any of the created agents have detected an anomaly.

Another embodiment of the present invention is directed to a method of detecting anomalies in information describing an electrical waveform created in an electrical circuit, the information being created from readings made by an oscilloscope. The method of this embodiment includes coupling the one or more signals read by the oscilloscope to an external device; determining, at the external device, the types of signals present in the one or more signals; creating an instance of an anomaly detection agent for each anomaly detection type available based on the types of signals present in the one or more signals; and notifying a user of the detection of an anomaly.

Another embodiment of the present invention is directed to a method for detecting waveform anomalies in an electrical waveform composed of one or more signals. The method of this embodiment includes receiving input information describing the electrical waveform, the input information including one or more data types; creating an instance of one or more agents having data type input requirements that are met by data types present in the input information; analyzing the input information with one or more of the created agents; and notifying a user in the event that any of the created agents have detected an anomaly.

The present invention and its advantages over the prior art will be more readily understood upon reading the following detailed description and the appended claims with reference to the accompanying drawings.

DETAILED DESCRIPTION

In general, the present invention relates to systems and methods for automatically analyzing an input waveform. Information related to the waveform may, for example, be received from an output of an oscilloscope, from a time-tag list generated, for example, by the methods or devices such as is disclosed in U.S. Pat. No. 6,263,290, or by other means. The received information, regardless of how received, may then be analyzed to determine which possible "agents" should operate on the data. As the term is used herein, "agent(s)" shall refer to a specific process that analyzes data for the purpose of discovering one or more particular possible anomalies that may be found in a particular data set that represents a waveform (regardless of the format of the data). The appropriate agents then analyze the data and, in some embodiments may notify a user that a particular anomaly has occurred. In some embodiments, the methods and devices may provide for informing the user of possible causes of the particular anomalies discovered and/or possible solutions that may serve to remove the anomalies.

FIG. 1 is a data flow that depicts one embodiment of a method according to the present invention. Information is received in an information receiving step 102. This information may be received in several different manners and from several different possible data input sources. For instance, the information could be voltage vs. time information 108 received from an oscilloscope. This voltage vs. time information 108 could also, for example, be live data that is received directly from the oscilloscope or it could be received from recorded information that is either stored on the oscilloscope or in other locations such as a time tag generator, personal computer or any other device having suitable memory for storage of such information. Alternatively, the information could be received from a time tag generator as time vs. time (T v. T) information 110. Such information may be received from any device that generates time vs. time information. The information could also be existing measurement results 112. This information may be received from the device operating the anomaly detection methods itself or from external data files.

Regardless of where the data is received from, the method determines the appropriate agents (step 104) to apply to the data. A more detailed explanation of how this determination is made is shown, for example in FIG. 2. The appropriate agent determination step 104 may determine that one or more agents can or should be applied to the data. After the appropriate agents have been determined, at a step 106 the appropriate agents are run on the data. As discussed in greater detail below, these agents can be run based upon selection by the user or automatically. In addition, these agents may run at all times or may be only run at specific times based on user selections or other selection criteria.

In addition to returning summary/descriptive information regarding the anomalies found, an agent could also return one or more sets of data containing information specific to the anomalies, in one or more formats, for either direct display or for further analysis and then display. Subsets of the information could also be returned for display. For example, only the events of interest could be displayed or events that exceed specific magnitude or amplitudes could be displayed. Regardless of the type of display, at step 108 the particular results are displayed to the user.

Figure 2:
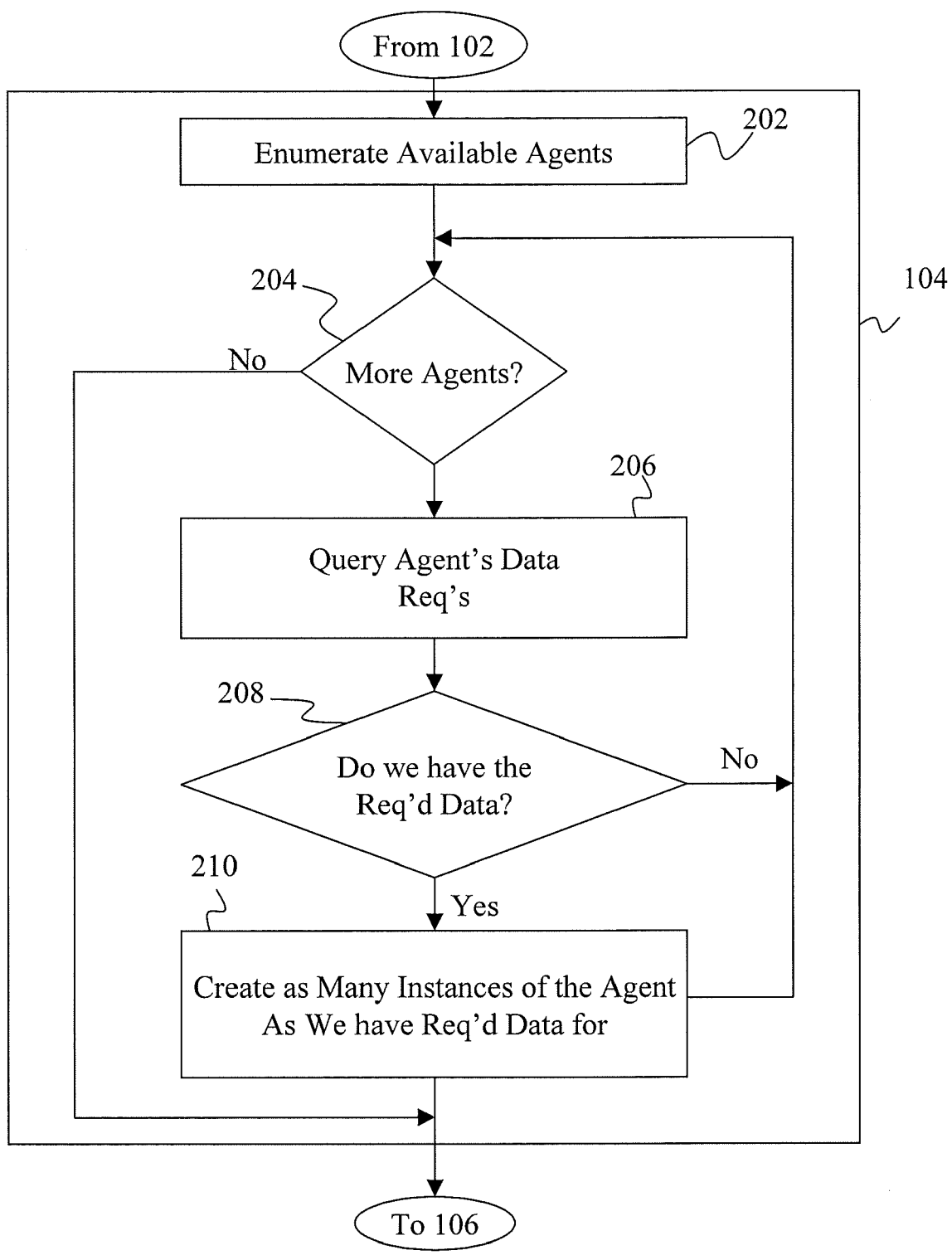
FIG. 2 is one example of a method by which the appropriate agents may be selected for application to a particular data set.

FIG. 2 is one example of a method by which the appropriate agents may be selected for application to a particular data set. The process begins, in this embodiment, by creating a list at step 202 of all of the possible agents. As will be discussed below there are an unlimited number of possible agents but a few examples of such agents include a detection of shelf on transition/metastability detection agent, an agent that determines whether an edge contains a shelf, an undershoot/overshoot/reflection detection agent, a histogram peak finding agent, a parameter drift finding agent, a parameter jump finding agent, an agent that detects bursting or other isolated behaviors, an agent that determines if a signal is a named signal standard such as SATA or PCI Express. Of course, the list created at step 202 may not be exhaustive. For example, a user may disable one or more of the possible agents. In such a case, the list of all possible agents may not include the disabled agents.

At step 204 it is determined if there are more agents to be examined. If not, the process is complete. If agents still remain, the data requirements of the next agent are queried at step 206. This involves determination of each of the types of data that the agent requires in order to operate. For any given agent the data requirements may include one or more of the following types of information: any clock signal; any data signal; any type of signal; any differential signal; any existing measurement; a particular existing measurement such as a period measurement; one or more time tag lists or combinations of any of the above as well as any existing fast Fourier transform measurements. Of course as one of ordinary skill will readily realize, the list of possible data requirements is not limited. This data may be received in several different forms and from several different sources. For instance the data may be received directly from the output of an oscilloscope or it may be received from a data file or any other information repository or device which can provide the required information.

At step 208 it is determined whether the available data for the particular agent being considered meets the requirements of that agent. If it does, an instance of the agent is created at step 210. In addition, if there is sufficient data to create several instances of a particular agent several instances may be created. For example, if a particular agent requires a single signal and three signals are available, then three instances of the agent may be created, one for each signal. Each agent instance can be turned on/off and may report results separately. If the required data for the particular agent is determined not to exist at step 208 and after step 210 the process returns to step 204 and the next agent is examined.

Figure 3:
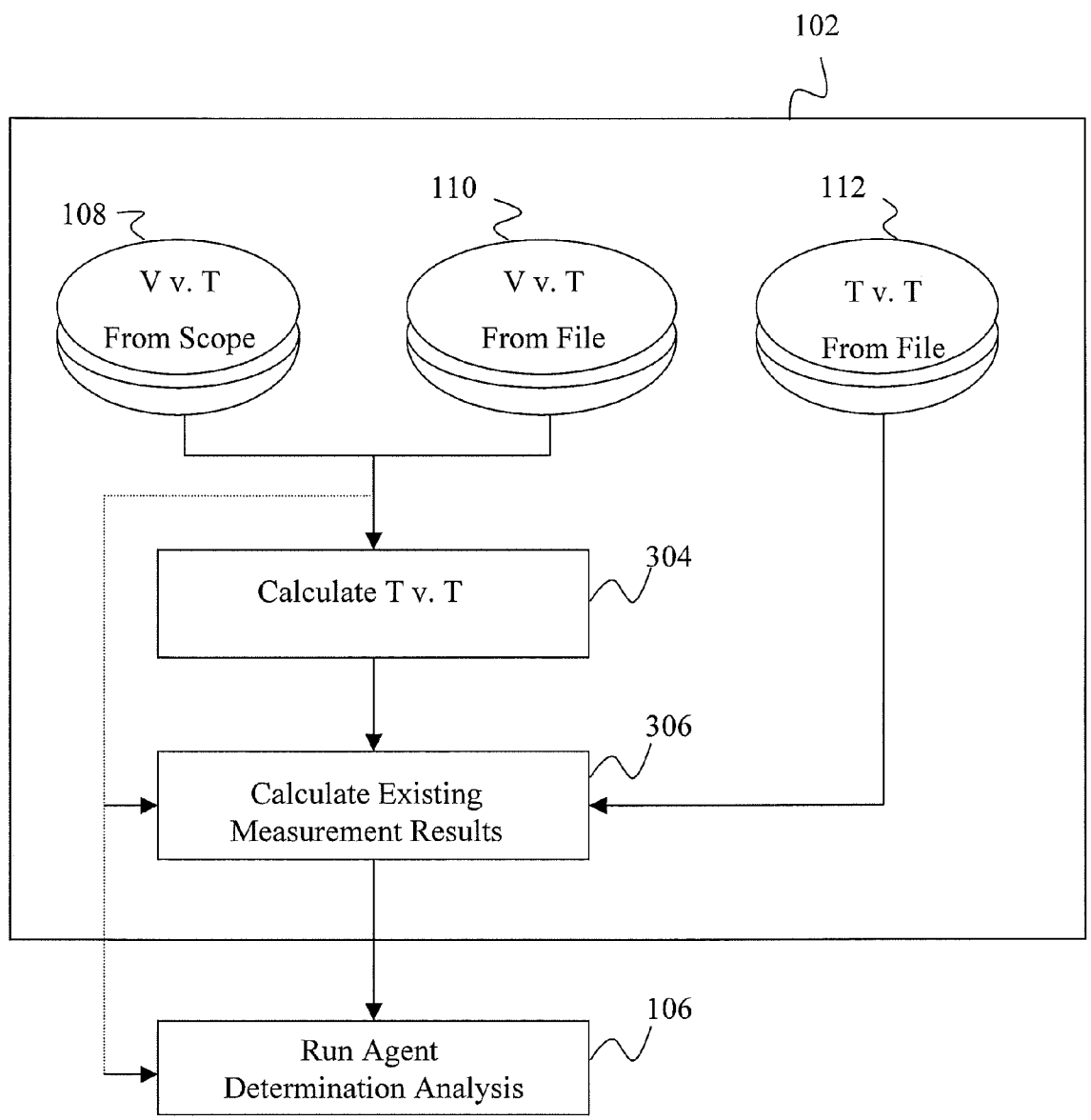
FIG. 3 shows how the received information may be received and transformed based on the type of information received.

FIG. 3 shows how the received information may be received and transformed (step 102 of FIG. 1) based on the type of information received. The data may be received, as discussed above, from many different sources. For example, the information may be received as V v. T information 108 from an oscilloscope, as V v. T information 110 from a file, or as T v. T information 112 from a file. In the event that the information is either V v. T information 108 from an oscilloscope or V v. T information 110 received from a file, at a step 304 a format independent transformation of the incoming data is performed. In one embodiment, voltage v. time information from an oscilloscope or voltage v. time information from a data file may be converted to a time v. time data file.

In step 306 measurement results may be calculated from the time v. time information. The results that may be calculated are more fully explained in U.S. Pat. No. 6,263,290, but of course other types of measurements could be done. The process then progresses to running of the agent analysis as described above in step 106 of FIG. 1. Of course Steps 304 and 306 could be skipped if the agent is looking for information directly from a scope or directly from a file.

Figure 4:
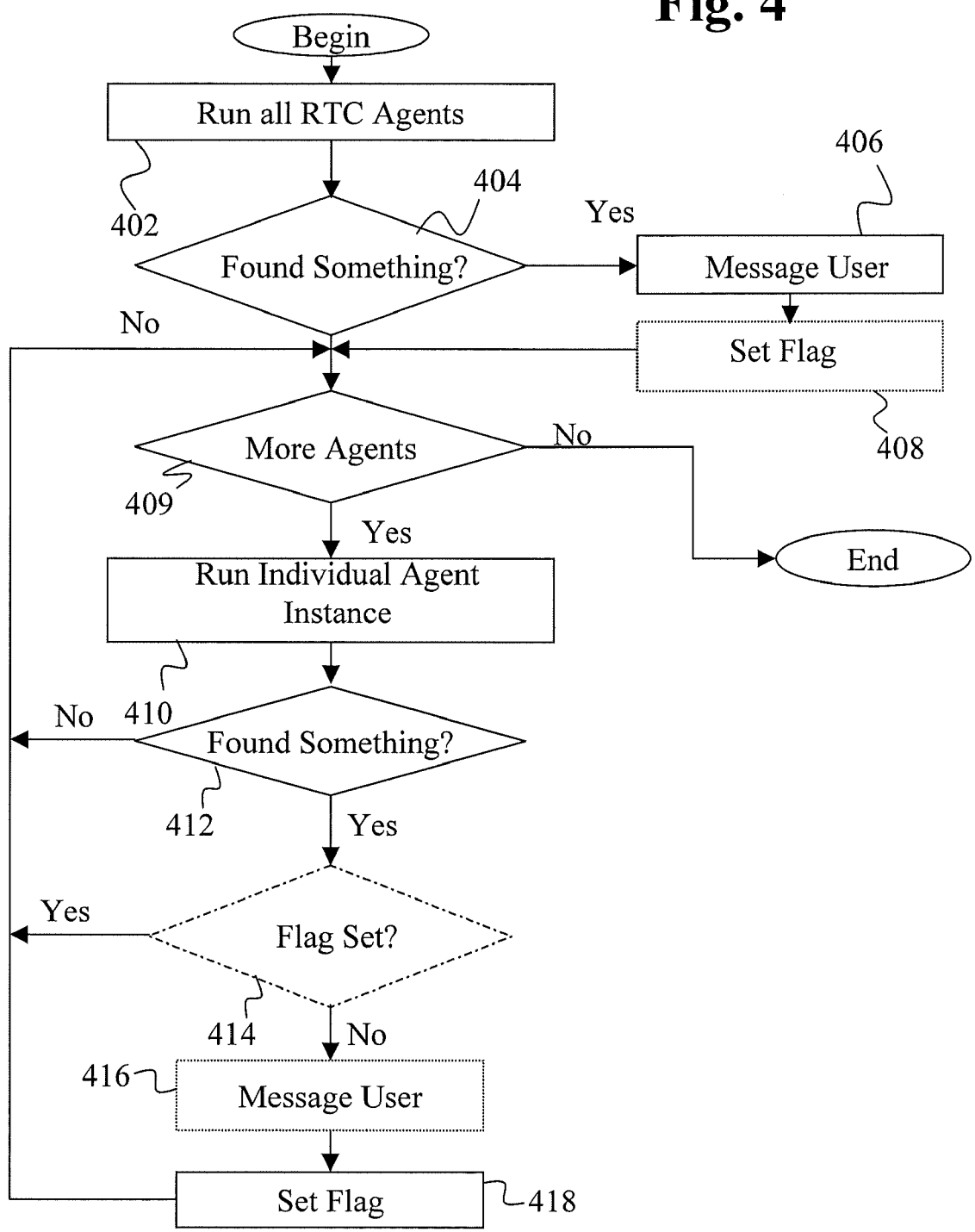
FIG. 4 shows an example of the process, in more detail, performed in the run agent analysis step of FIG. 1.

FIG. 4 shows an example of the process, in more detail, performed in the run agent analysis step 106 of FIG. 1. The process begins at step 402 where all run to completion agents are run. The designation "run to completion" (RTC) is one of three possible run status levels that each agent may be assigned. "Run to completion" as the term is used herein shall refer to an agent that runs at all times. That is, these agents are not interruptible and are applied to all data that is being processed. Another state is a background state in which agents run if time is available to do so. Another state is an off state in which the agent does not run at all.

Referring back to FIG. 4, as each run to completion agent is run (or after all run to completion agents have been run) a decision is made at step 404 as to whether the particular anomaly that a particular agent is searching for has been discovered. If yes, at step 406 a message may be presented on a display to the user informing them that the particular anomaly has been discovered. Optionally, at step 408 a flag may be set that a particular agent has discovered an anomaly. This flag may serve to stop additional detections of the particular anomaly, or optionally detections of any anomaly, from being displayed to the user. Of course this step is optional and the messages could be presented to user every time an anomaly is discovered.

After all of the run to completion agents have been run, after step 404 the process continues to step 409, where it is determined if there are additional background agents to run. If not, the process ends. Otherwise, processing continues to step 410 where each background agent begins the process of running the instance of that agent. At step 412 it is determined whether each agent has discovered any anomalies and, if so again, an optional flag may be checked to see if has already been set and the user is notified at step 416 if a flag has not already been set to prevent notifications. At step 418 an optional flag may be set if it is the first instance in which this agent, or optionally any agent, has found an anomaly. Processing then returns to step 409

Figure 5:
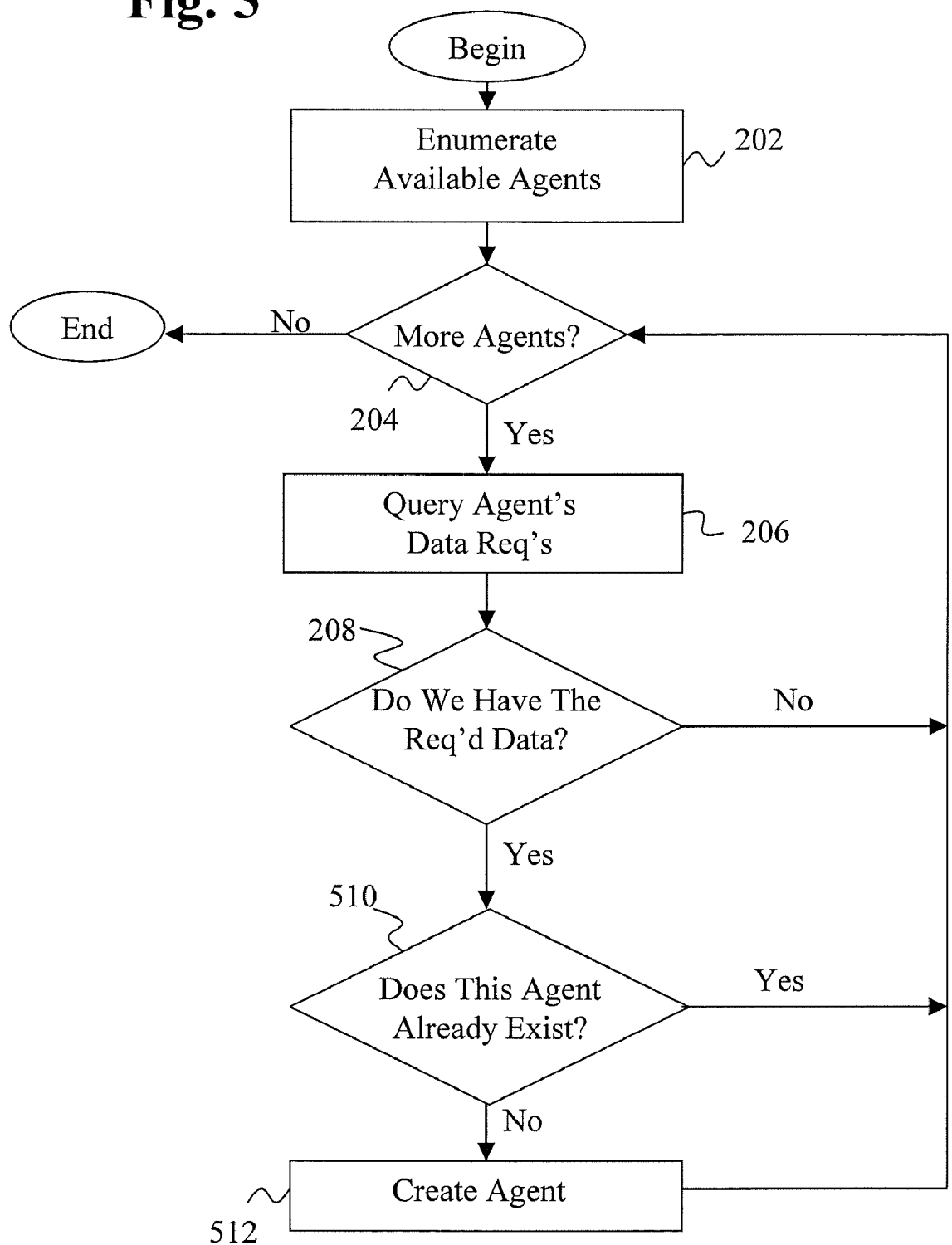
FIG. 5 shows another example of the process disclosed in FIG. 2 when a new data set is received in the system.

FIG. 5 is another example of the process disclosed in FIG. 2 when a new data set is received in the system. The method shown in FIG. 5 includes all of the steps 202-208 shown in FIG. 2. The difference between the methods shown in FIGS. 2 and 5 is that in the method shown in FIG. 5, only a single instance of a particular agent is created. To that end, following step 208, it is determined at step 510 if a particular agent has previously been created. If so, the agent is not created and processing returns to step 204. Otherwise, the agent is created at step 512 and processing returns to step 204.

It should be understood that as various views brought up on a device such as the one disclosed in U.S. Pat. No. 6,263,290 are opened or closed different agents may or may not be applicable. For instance, if the information required to support an agent that is currently running ceases to be available for some reason, then that particular agent is deleted according to the process shown in FIG. 6.

Figure 6:
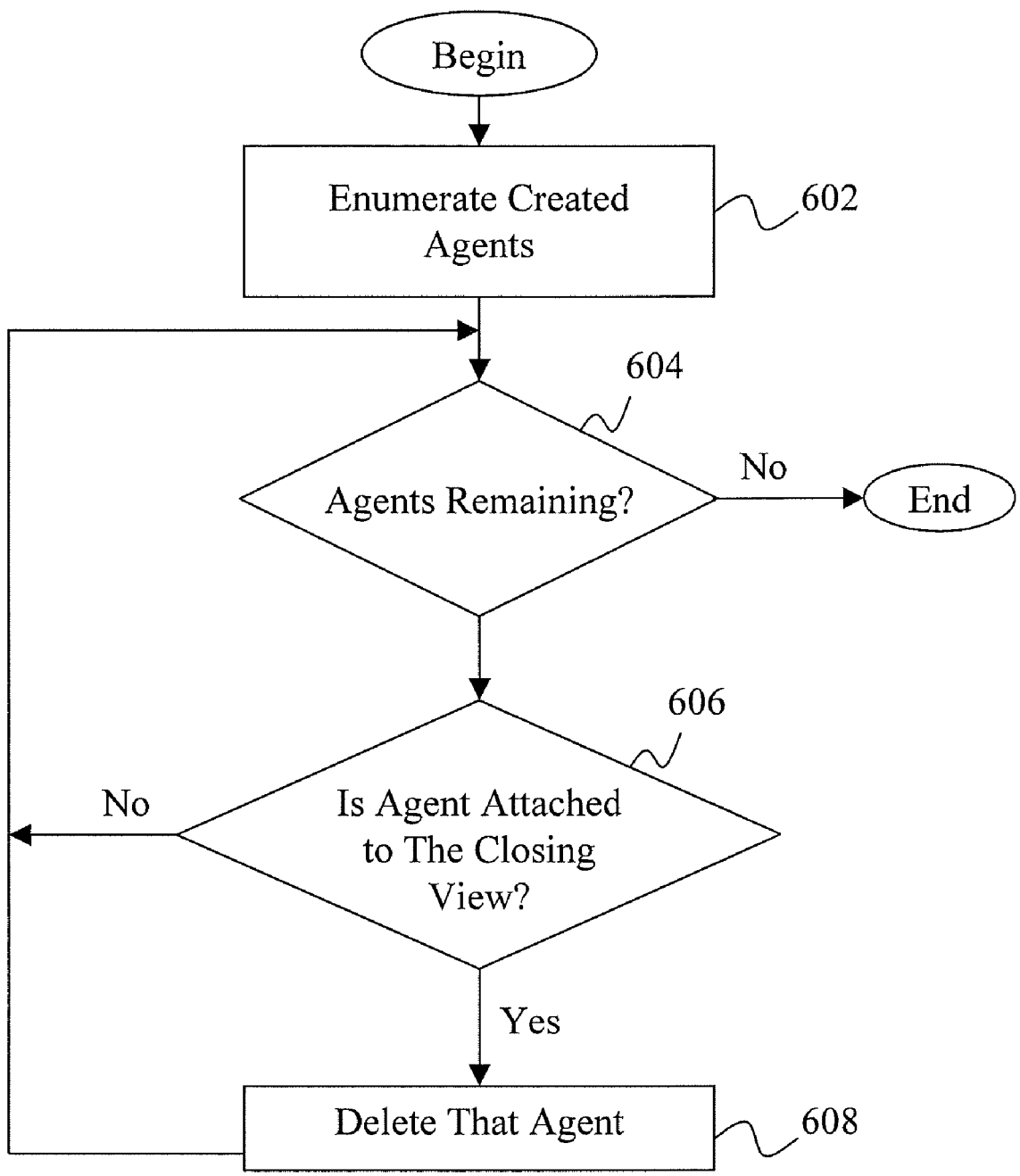
FIG. 6 shows a method by which an agent whose required information is no longer available is deleted.

FIG. 6 shows a method by which an agent whose required information is no longer available is deleted. At step 602 a list of currently running agents is created. The list may include all agents, regardless of type. At step 604 it is determined if additional agents remain. If not, the process ends. If so, at step 606 it is determined if the agent is attached to a closing view. That is, it is determined if any part of the information required to support that agent was being produced by the closing view. If the agent is not attached, processing returns to step 604 and the next agent is examined. Otherwise, the agent is deleted at step 608 and processing then returns to step 604.

The proceeding description has related generally to how the system in general and the methods conducted thereby operate in order to determine whether a hidden anomaly has been detected. The following descriptions focus on specific anomaly detection algorithms that may be used by particular agents operated by the system.

In the course of describing these agents, it will be apparent that many numerical values are used when making calculations and tests to determine the presence or absence of an anomaly. It should be understood that these values may be individually set by one or more means, including but not limited to, a predetermined value; a user-specified value; a value calculated in such a way as to allow a particular input data set that had previously caused a particular agent to find an anomaly to no longer find that anomaly in that data set; a value calculated in such a way as to allow a particular input data set that had previously not caused a particular agent to find an anomaly to now find that anomaly in that data set; a value obtained from a remote location, such value having been set by agreement among a group of users.

Figure 7:
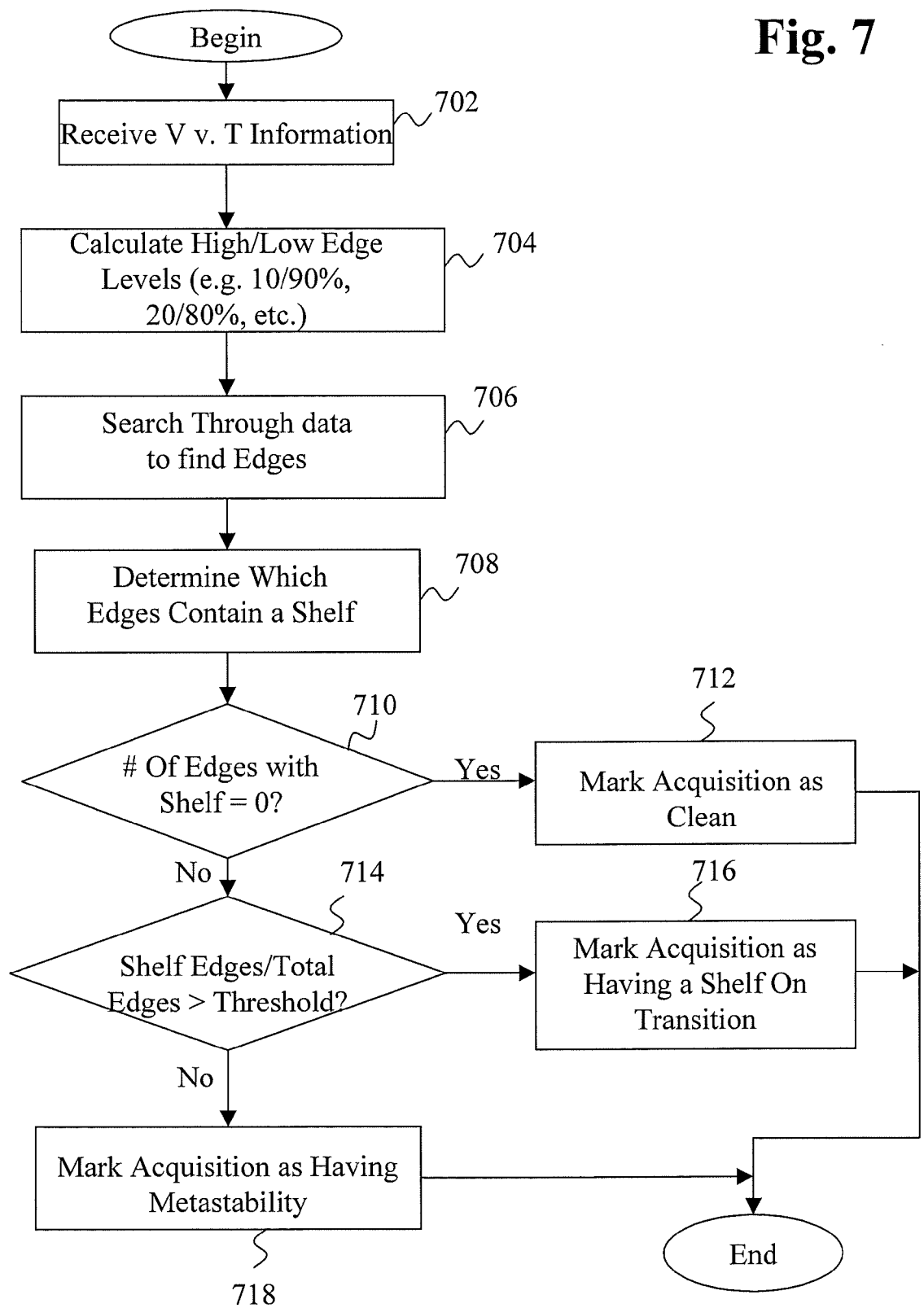
FIG. 7 shows an example of one possible method by which a shelf on a transition or meta-stability may be detected.

FIG. 7 shows an example of one possible method by which a shelf on a transition or meta-stability may be detected. At step 702 V v. T information is received. As discussed above, this information may be received from any number of sources. In some embodiments, the information may be converted into T v. T format but is not required.

At step 704 the high and low values of an edge may be calculated. For example, an edge may be defined by the transition of a value from a first value to a second value. Examination of a particular signal may yield the expected values of the first and second values by taking an average high value and an average low value of a signal. Regardless, it may be beneficial to, in some instances, define the high value as a percentage of the average high value and the low value as a lesser percentage thereof. For example, if a signal varies between 0 and 1, the high value may be set to 0.9 and low value set to 0.1. Of course other percentages or scales or user-specified values could be used.

At step 706 the acquired data is examined to find all edges. This may include determining all instances where the signal changes from the high value to the low value and vice versa. In addition, an edge may be detected by determining where the slope of the signal exceeds a particular threshold. Of course, edges could be found in other ways as well.

Figure 8:
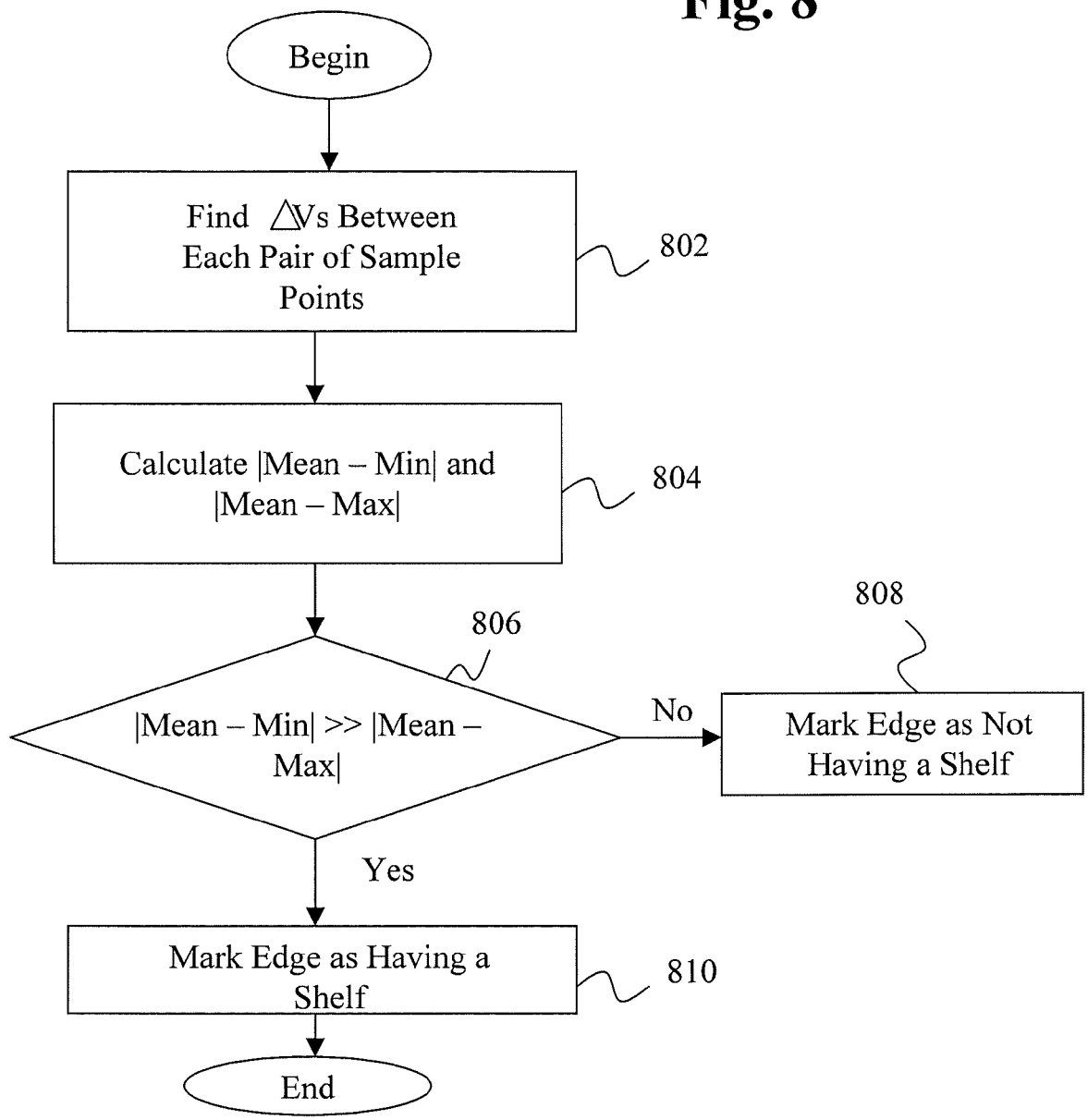
FIG. 8 shows an example of one possible method by which a determination of whether an edge contains a shelf may be made.

At step 708 each edge is examined to determine if it includes a shelf One method of determining if an edge includes a shelf is shown in FIG. 8. Regardless of how edges having shelves are identified, at step 710 it is determined if the number of edges having a shelf is equal to zero. If it is, at step 712 the acquisition is marked as being clean from shelves having an edge and the process ends. Of course, any type of indication may be made for the "marking." For example, marking may consist of merely ending the process and the absence of a mark may indicate that the data set is clean. As used herein, the term "data set" shall refer to any data, be it live or previously created and saved or derived from such live or saved data, upon which embodiments of the present invention may be implemented on.

If, as determined at step 710, the number of edges having a shelf is not equal to zero (i.e., one or more edges do have a shelf) at step 714 it is determined if the number of edges having a shelf is much less than the total number of edges examined. In this embodiment, the number may be "much less" if 95% of the edges do not include shelves. Of course, this value could be varied by configuration or by user interaction. If the number of edges having a shelf is not much less than the total number of edges examined, the acquisition is marked as having transitions with shelves at step 716 and the process ends. Of course, this marking could be a single mark for the entire data set, or each individual instance of the shelf could be marked separately.

In the event that the number of edges having a shelf is much less than the total number of edges, at step 718 the acquisition is marked as having metastability. As is known in the art, metastability indicates that given a certain starting signal (i.e., a logical zero) it is not certain that the transition will always transition to a desired next state signal (i.e., a logical 1). If the acquisition represents a clock signal, metastability could result in catastrophic failure.

FIG. 8 shows an example of one possible method by which a determination of whether an edge contains a shelf may be made. At step 802 the change in voltage between each pair of sample points that collectively represent an edge is found. The absolute value of the difference between the mean of the voltage changes and the minimum of the voltage changes and the absolute value of the difference between the mean of the pair of sample points and the maximum of the voltage changes are determined. At step 806 it is determined if the absolute value of the difference between the mean and the minimum is much greater than the absolute value of the difference between the mean and the maximum. In one embodiment, the ratio to determine that a value is much greater than another value is 5 to 1. Of course, this ratio may be adjusted based on the particular situation.

If the absolute value of the difference between the mean and the minimum is much greater than the absolute value of the difference between the mean and the maximum, at step 810 the edge is marked as having a shelf. Otherwise, at step 808 the edge is marked as not having a shelf.

It will be understood, that the process shown in FIG. 8 is performed on each edge in the acquisition in one embodiment. In another embodiment, only a portion of the edges may be examined.

Figure 9A:
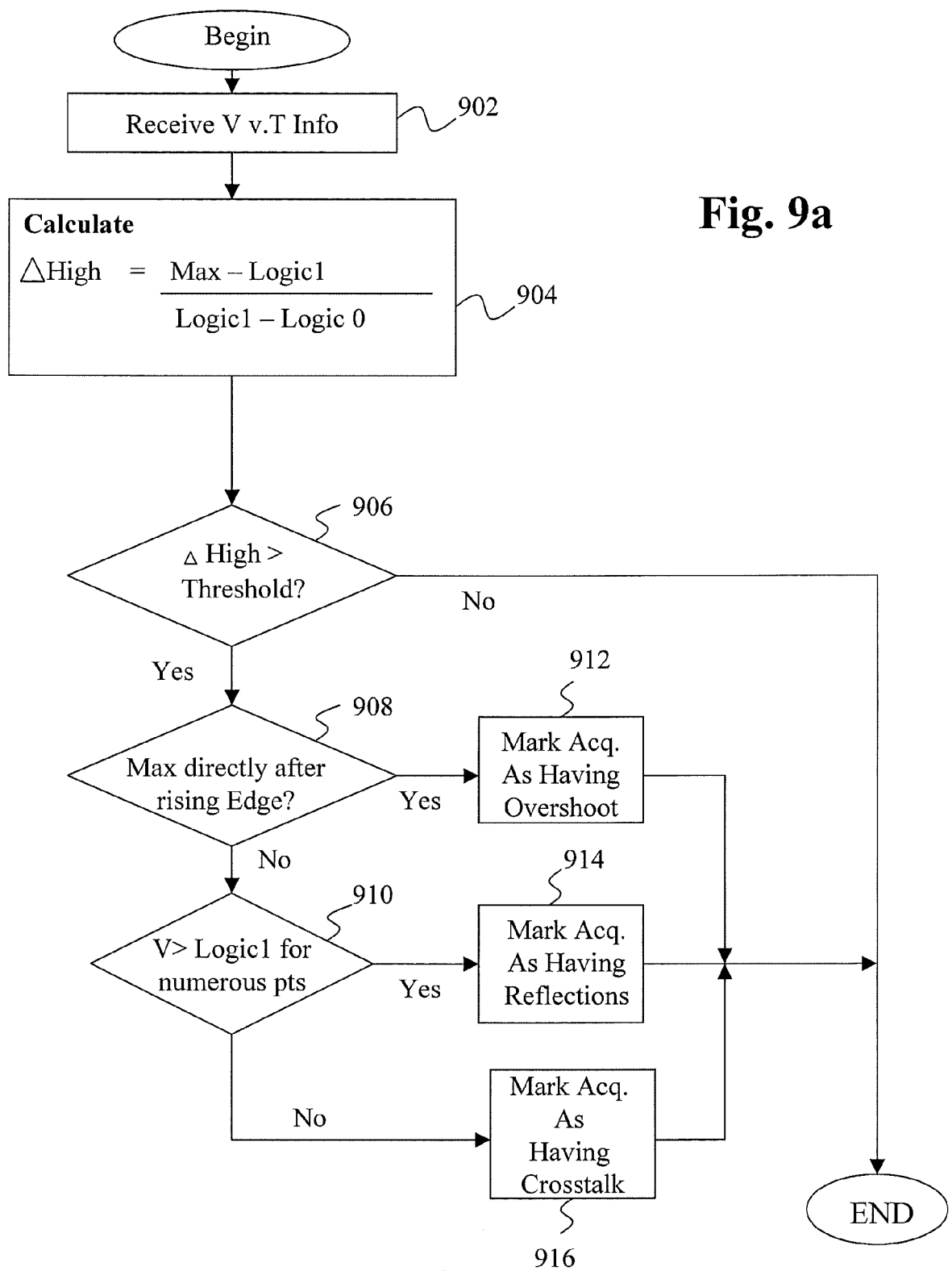
FIGS. 9a and 9b show example methods by which overshoot, undershoot, reflection or signal crosstalk may be detected.
Figure 9B:
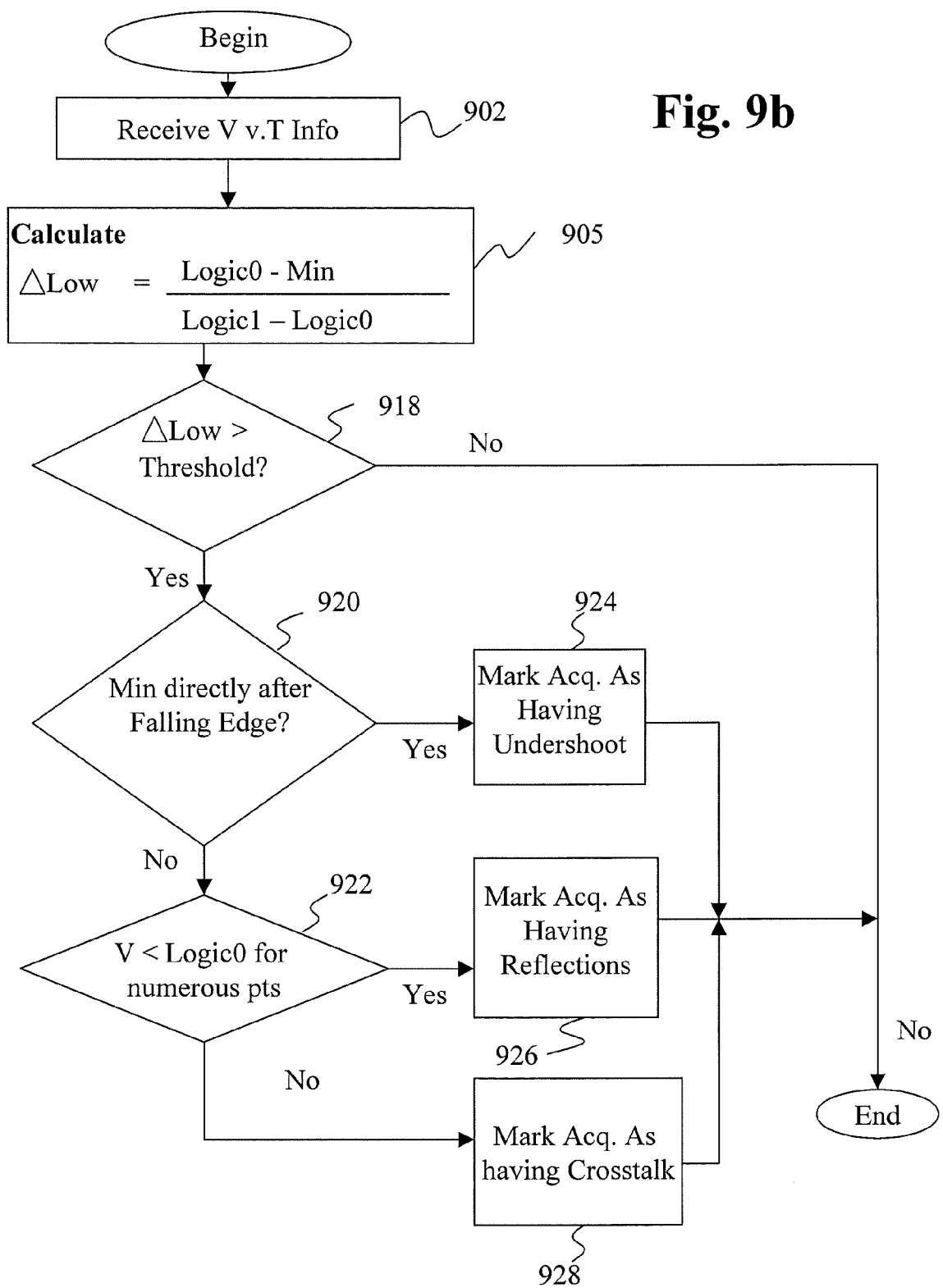

FIGS. 9a and 9b show example methods by which overshoot, undershoot, reflection or signal crosstalk may be detected. In particular, FIG. 9a shows a method for detecting overshoot, reflection or signal crosstalk for a rising edge. At step 902 V v. T acquisition information is received. At step 904 a highchange value is calculated. The highchange value is equal to (Max−Logic1)/(Logic1−Logic0) where Max is the maximum value in the acquisition, Logic 1 is a value assigned to an expected logical high value and Logic 0 is a value assigned to an expected logical low value. For example, in a 3V system, Logic 1 may equal 3V and Logic 0 may equal 0V. Of course, any appropriate values may be used based on the acquisition information received, or may be calculated based on the information itself.

At step 906 it is determined whether highchange is greater than a threshold value. In one embodiment, the threshold value is preset. In another, the value is user configurable. If highchange does not exceed the threshold value, the process ends. If highchange exceeds the threshold, at step 908 it is determined if Max occurred directly after a rising edge. "Directly" could refer to a next sample or within specific range following the rising edge. Regardless, if Max is directly after the rising edge, the acquisition is marked as including overshoot. If Max is not directly following a rising edge, it is determined at step 910 if the input voltage values exceed Logic 1 repeatedly. If so, the acquisition is marked as having reflections at step 914. In the event that the input voltage values do not repeatedly exceed Logic 1, the acquisition is marked as including crosstalk at step 916.

FIG. 9b shows a method for detecting undershoot, reflection or signal crosstalk for a falling edge. At step 902 V v. T acquisition information is received. At step 905 a lowchange value is calculated. The lowchange value is equal to (Logic0−Min)/(Logic1−Logic0) where Min is the minimum value in the acquisition. At step 918 it is determined if lowchange is greater than a threshold. Again, this threshold may be preset or adjustable by the user. If lowchange is less than the threshold, the process ends. Otherwise, at step 920 it is determined if Min directly follows a falling edge; if so, the acquisition is marked as including undershoot at step 924. If not, at step 922 it is determined if the input voltage values are repeatedly less than Logic0. If so, the acquisition is marked as including reflections at step 926 and the process ends. Otherwise, the acquisition is marked as having crosstalk at step 928 and the process ends.

Note that while the preceding paragraphs have specifically described a process where highchange and lowchange are calculated based on the entire data set, it will be readily apparent to those skilled in the art that the same analysis could be performed with highvalue and lowvalue being calculated independently for each edge in the data set.

Figure 10:
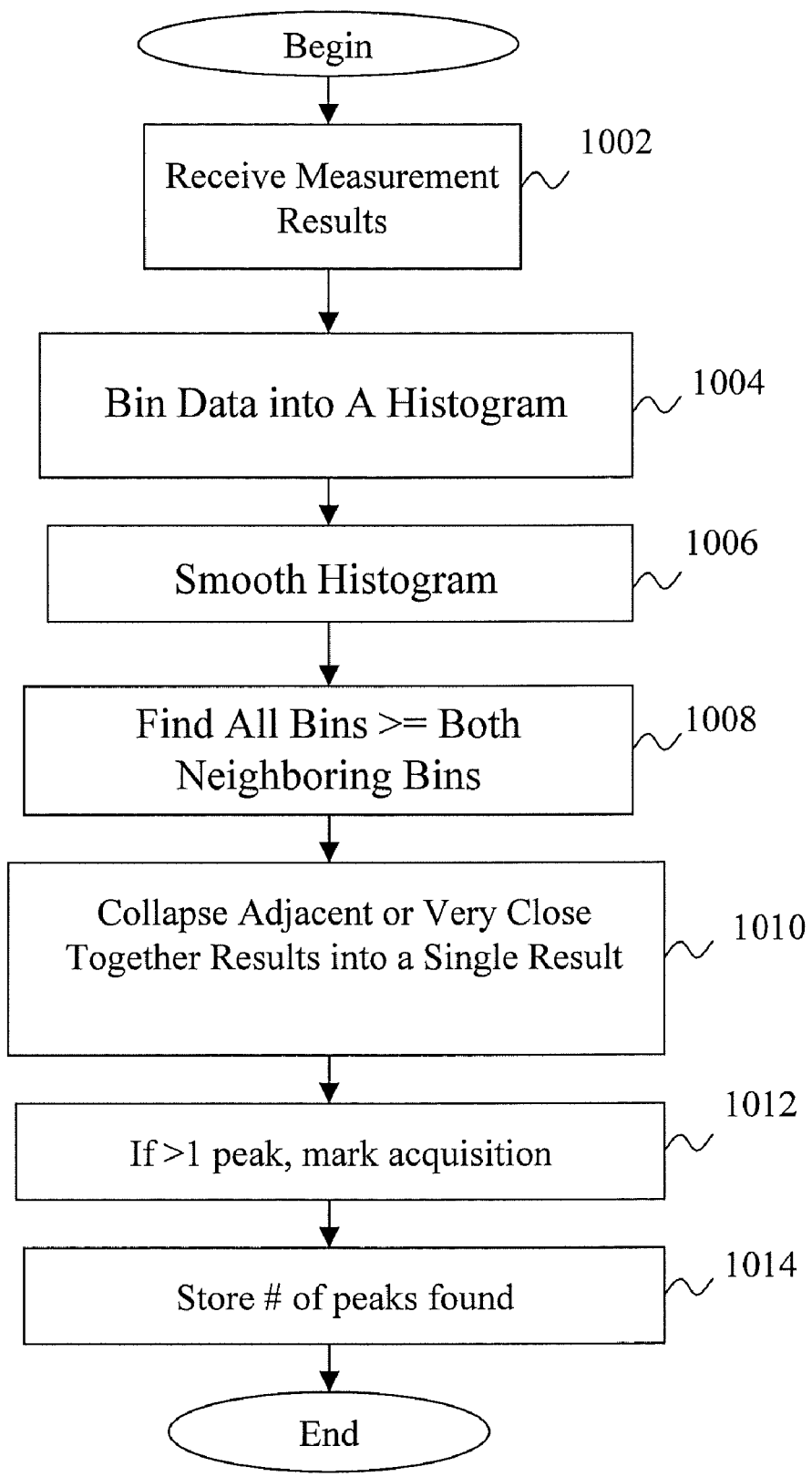
FIG. 10 shows an example of one possible method by which peaks in a histogram may found.

FIG. 10 shows an example of one possible method by which peaks in a histogram may found. At step 1002 measurement results (an acquisition) are received. At step 1004, the measurement results are binned into a histogram which is smoothed at step 1006. At step 1008, all bins that are equal to or greater than both of their neighbors are located. The located bins are then collapsed together at step 1010 to find the location of a peak. In a stable waveform, this should generally result in a single peak. However, variations could indicate any number of anomalies. As such, if the number of peaks exceeds 1, the acquisition is marked as including multiple peaks at step 1012. The marking may include marking each peak in the histogram separately, along with its amplitude. The number of peaks may, optionally, be stored for later use at step 1014.

Figure 11:
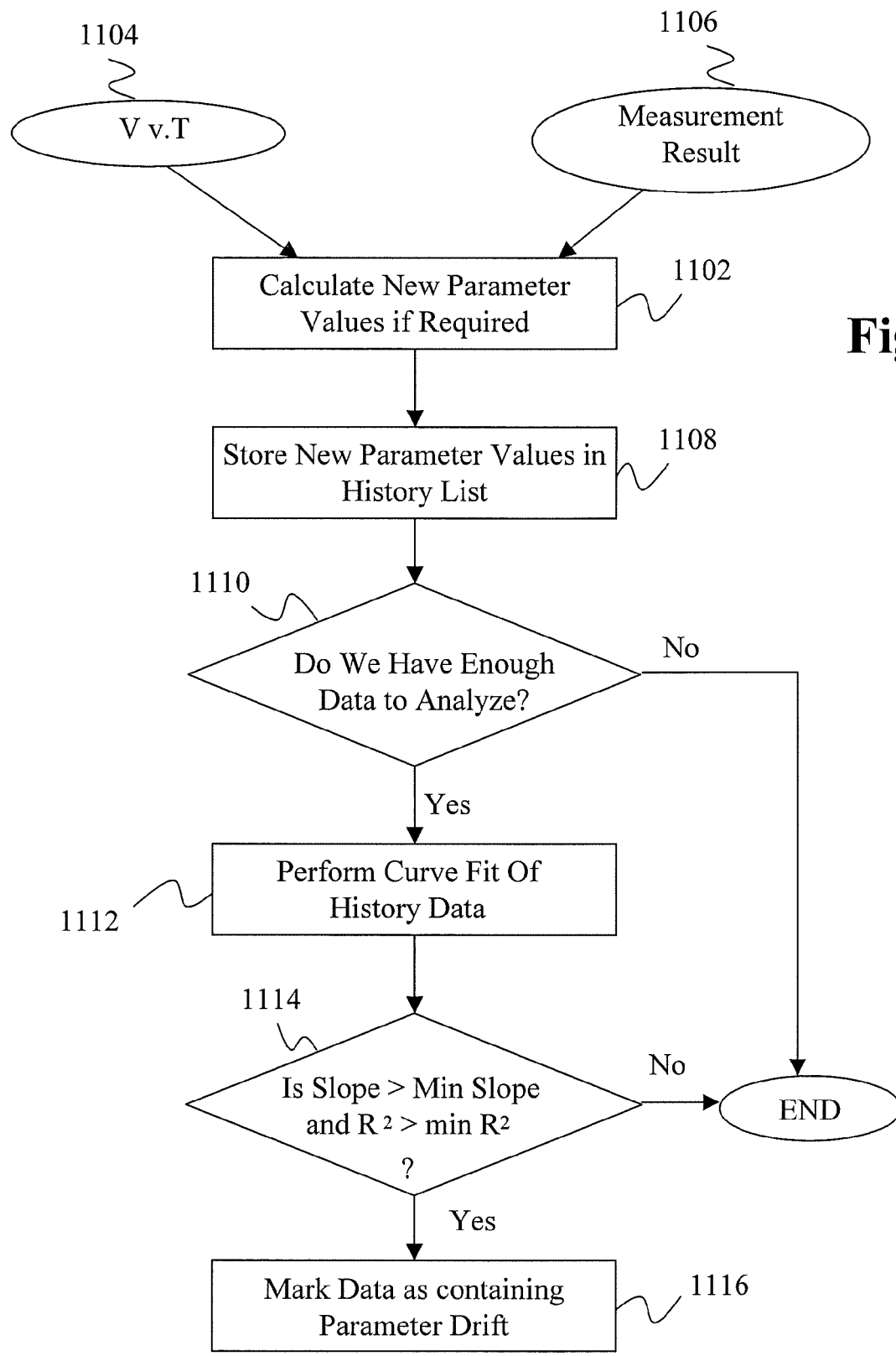
FIG. 11 shows one example of a method by which drift in a particular parameter may be detected.

FIG. 11 shows one example of a method by which drift in a particular parameter may be detected. At step 1102 any parameter of interest is calculated, if needed, from acquisition information received from either live or saved V v. T data 1104 or measurement results 1106. A few examples of parameters are mean and peak-to-peak, but obviously many other choices are possible. These values are stored in a historical parameter listing at step 1108. At step 1110 it is determined if enough information exists to perform the analysis. If not, the process ends. In one embodiment, many periods or other measurement intervals may be needed to perform the analysis.

In the event that there is enough data, at step 1112 the historical data is subjected to curve fitting techniques, for example a linear least-squares algorithm. At step 1114, is it determined if the resultant curve has a slope that is greater than a configurable value MinSlope which represents the minimum parameter drift rate that is considered significant, and a goodness-of-fit parameter R squared that is greater than a configurable minimum goodness-of-fit threshold. In the event that they do, the data is marked as containing parameter drift at step 1116. Otherwise, the process ends.

Figure 12A:
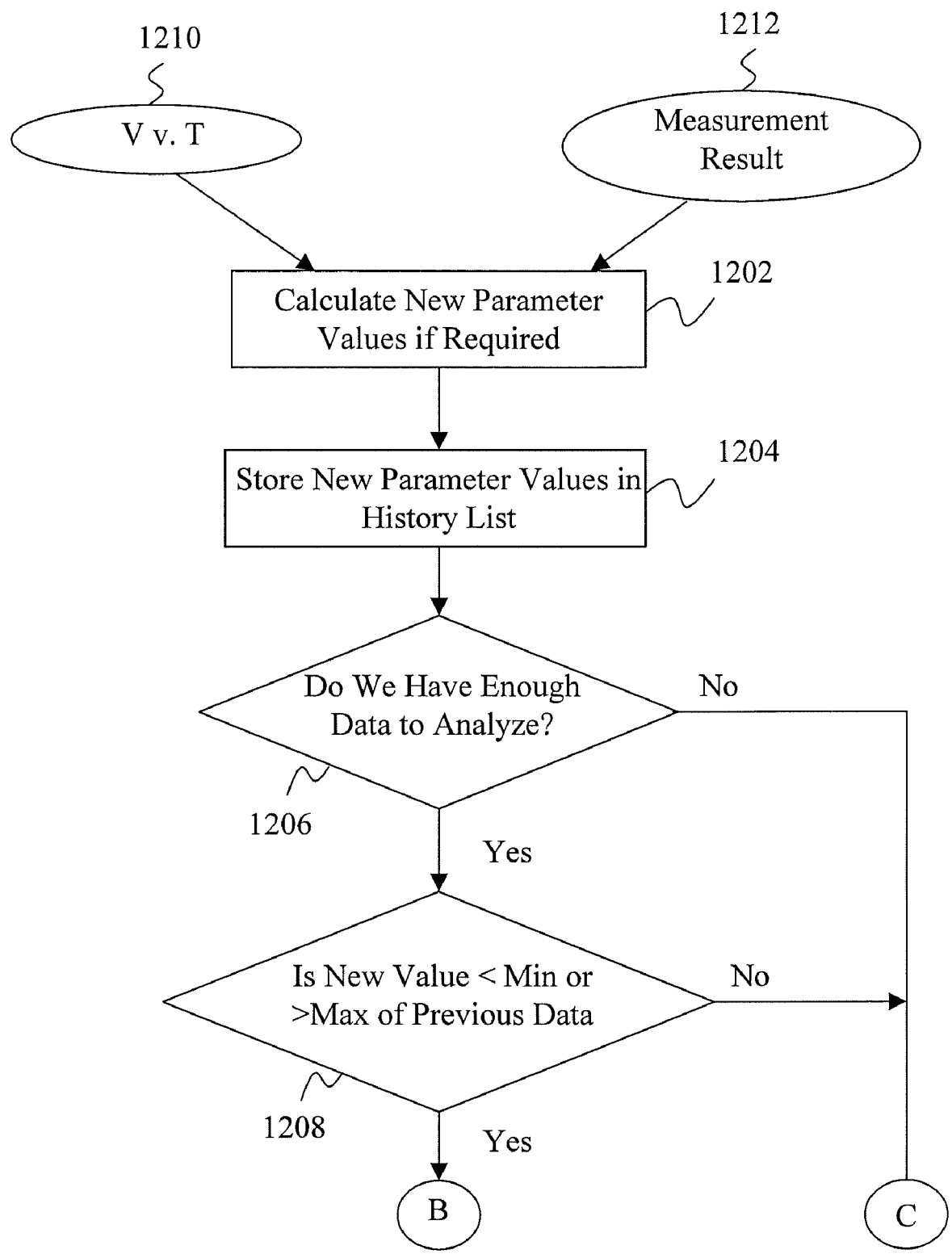
FIGS. 12a and 12b show an example of a method by which a jump in a particular parameter may be detected.
Figure 12B:
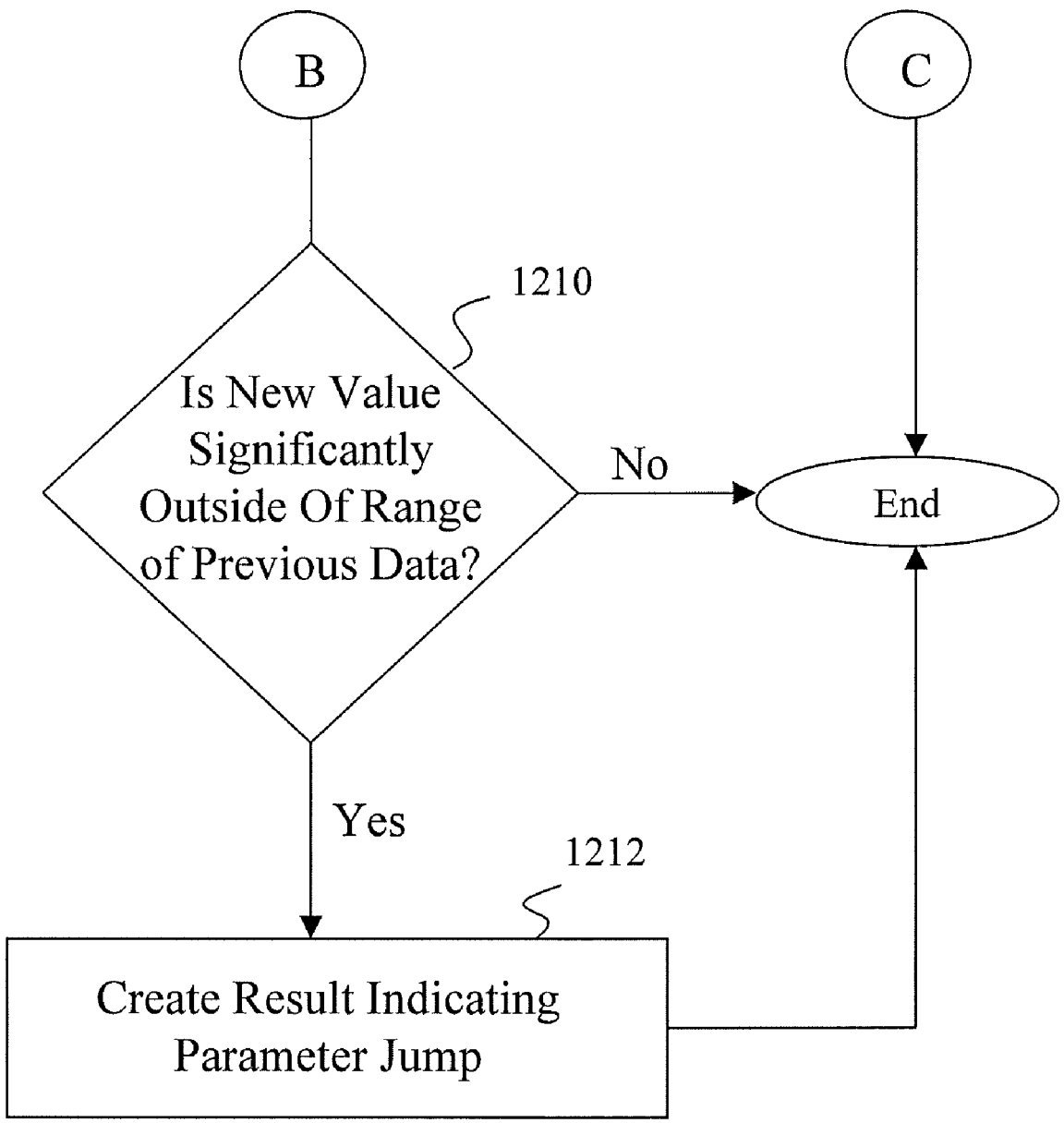

FIGS. 12a and 12b show an example of a method by which a jump in a particular parameter may be detected. At step 1202 parameter values, if required, are calculated. These parameter values may be calculated from live or saved data in voltage v. time format 1210 or from pre-existing measurements 1212. Regardless, the parameter values that are calculated may include but are not limited to mean, peak-to-peak, or any other parameter that may be chosen. At step 1204 the parameter values are stored in a history list. At step 1206 it is determined whether there is enough data to analyze. In one embodiment this determination may include setting thresholds for the number of parameter values required in order for a meaningful determination to be made. Of course this threshold can be preset or user configured. In the event there is not enough data to be analyzed, the process is ended. Of course this process can be restarted at any time. For example, if additional voltage versus time information 1210 is received additional parameter values could be determined and added to the history list at which point enough data for analysis may be present.

In the event that there is enough data to analyze at step 1208 it is determined whether the new value in the parameter list is less than the minimum value or greater than the maximum value of previous data. In the event that neither of these conditions is true the process ends. Otherwise, if one or both of the two conditions are met, it is determined at step 1210 whether the new value is significantly out of range of previous data. The level of "significance" may be user configurable or a pre-set value. In the event that the new value is not significantly out of range of previous data the process ends. Otherwise, at step 1212, the data is marked indicating that a parameter jump has occurred. Of course this process may be repeated each time new data is received.

Figure 13:
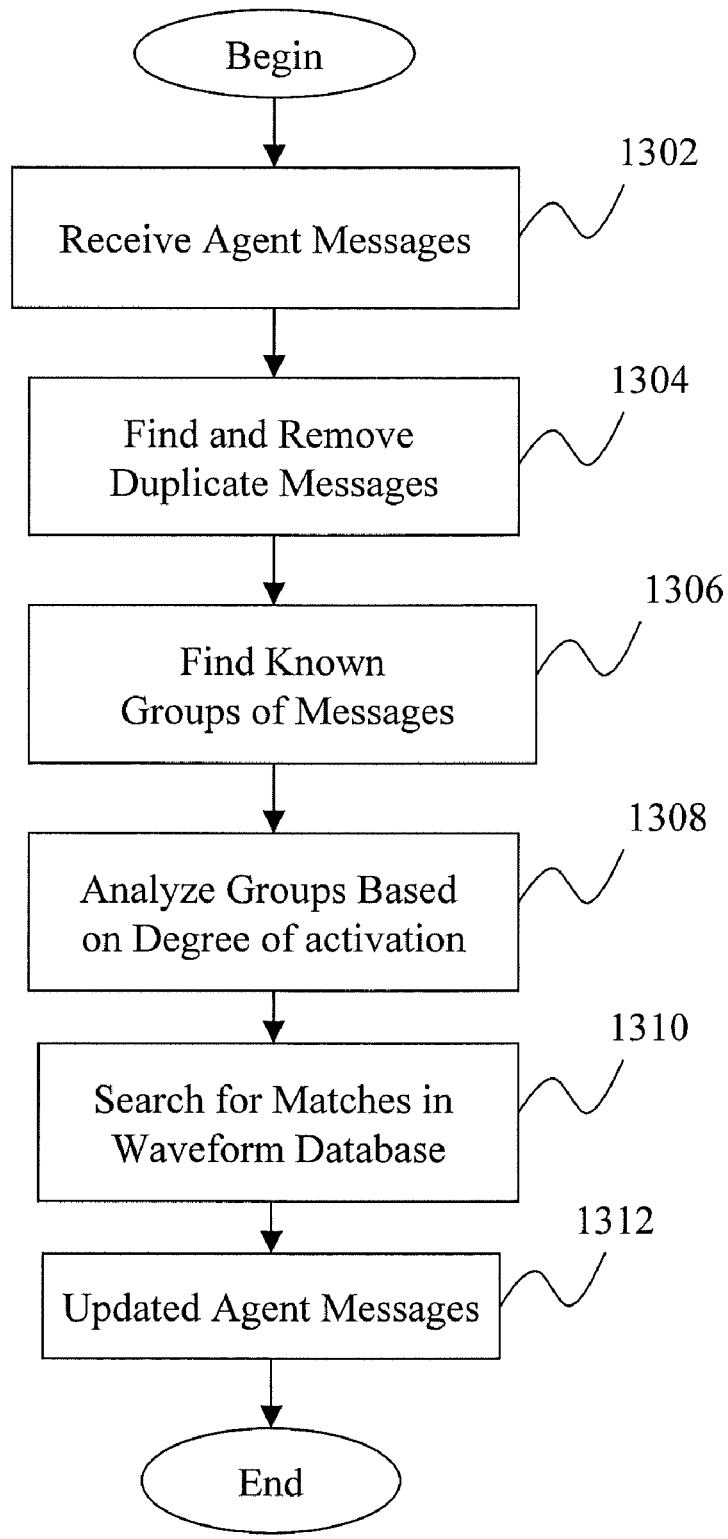
FIG. 13 shows an agent messaging controller according to one embodiment of the present invention.

FIG. 13 shows an agent messaging controller according to one embodiment of the present invention. As discussed above each of the agents may create one or more markings or other type of indication that a particular anomaly has been detected. In some instances each time that an anomaly is detected a message is created. Regardless, at step 1302 messages from all the running agents are received. At step 1304, all duplicate messages maybe removed. At step 1306 the messages may be grouped together based on known predetermined algorithms that relate to known anomaly combinations that may be present in a particular waveform. At step 1308 the agents may be analyzed based on the degree of activation achieved by each agent. A degree of activation may be characterized in that the degree represents the amount a certain value exceeds a particular threshold. For example, an overshoot value that is two times the expected value has a higher degree of activation than one that exceeds the expected value by one and a half (1.5) times. If certain agents produce responses with particular degrees of activation, it may indicate that a certain anomaly consisting of multiple variables exists. At a step 1310 a database, which may be maintained either locally or at a remote location, may be compared to the groups to see if an existing waveform has the groups of anomalies currently being detected and into what classification such a group may be placed. In the event that such a classification exists at step 1312 a message provided to the user may be updated. For instance, if parameter drift and metastability are both found there may be a specific anomaly which includes both of those. The updated agent message provided at step 1312 may give a title to such an anomaly as well as optionally additional information about the causes and effects of the anomaly. In some embodiments, the agent messaging controller may provide a single result which specifies the overall 'health' of the signal being analyzed, based on the number, type, and degree of activation of each available agent.

Figure 14:
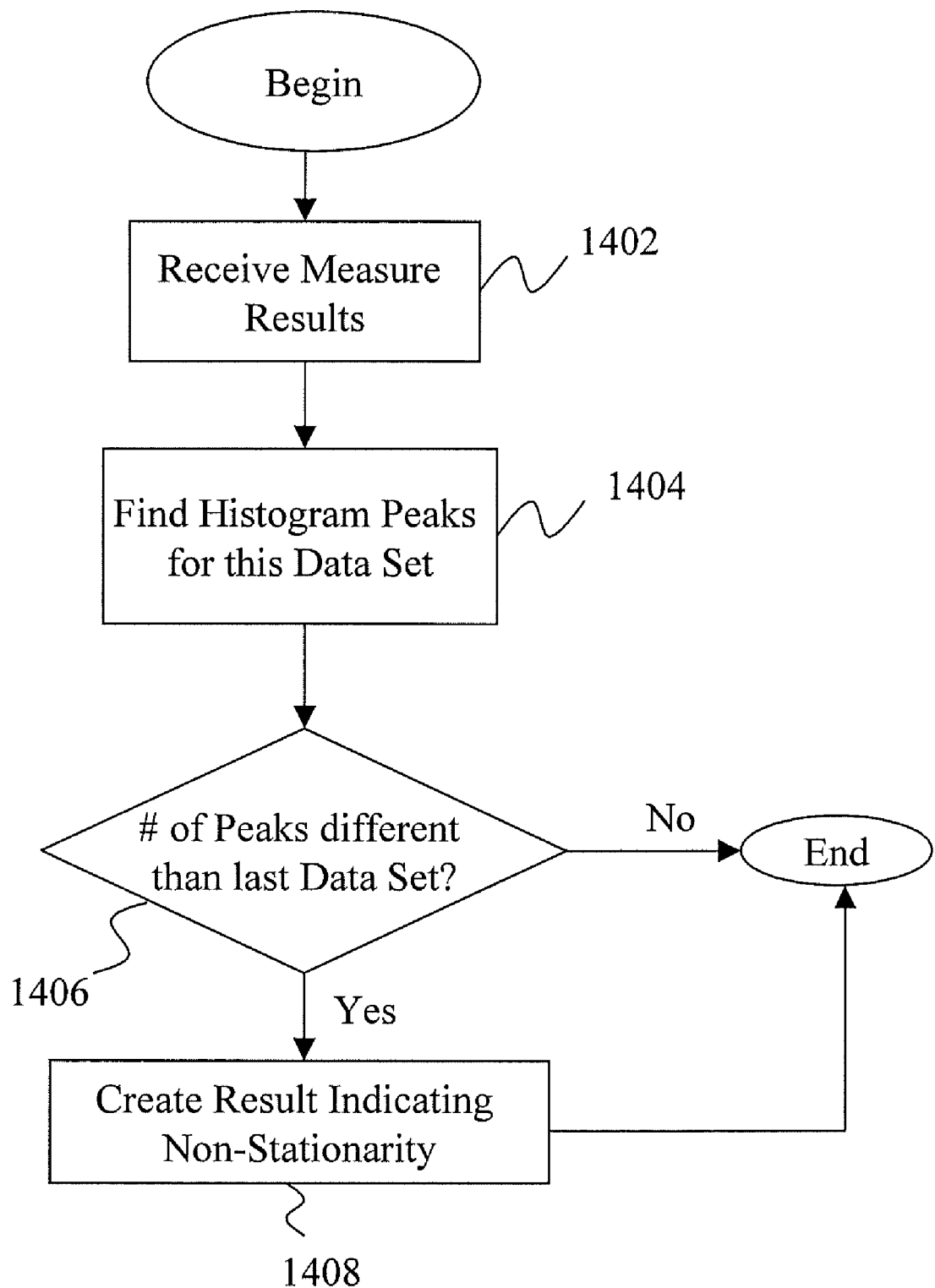
FIG. 14 shows a method by which non-stationarity may be found.

FIG. 14 shows a method by which non-stationarity may be found. At step 1402 measurement results are received as described above. Histogram peaks are found for the data set that comprises the measurement results in step 1404. These peaks may be located using the method described previously for FIG. 10 or by other means. The number of peaks in the current data set is compared to the number of peaks from a prior data set at step 1406. If they are the same the process ends. Otherwise, the results are marked as non-stationary at step 1408. This marking may include information regarding the number and position of peaks in the previous data set as well as the number and position of peaks in the current data set.

Figure 15:
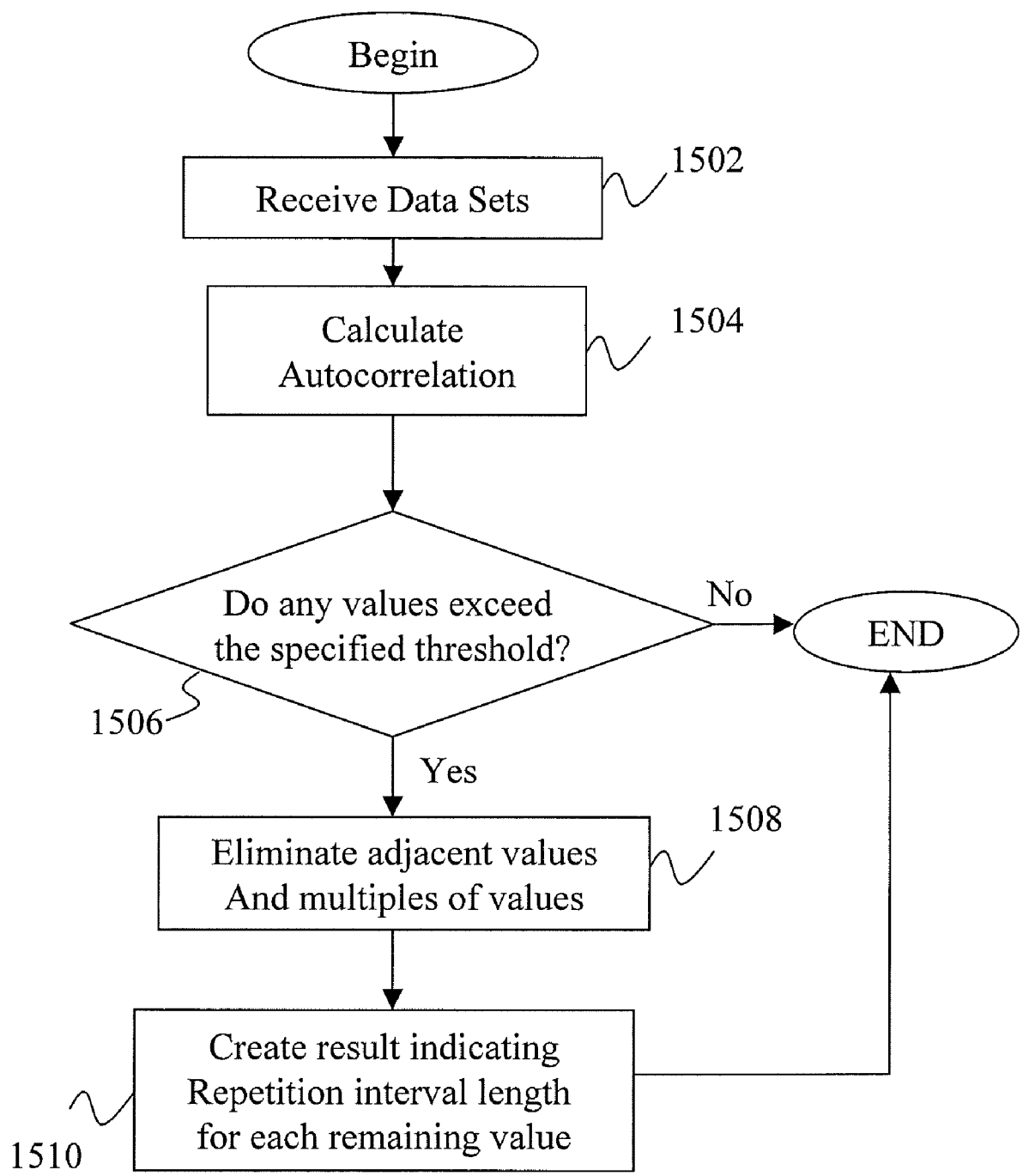
FIG. 15 shows a method for repetition interval detection.

FIG. 15 shows a method for repetition interval detection. This method, like all other methods disclosed herein, may be implemented in its own agent. At step 1502 measurement results are received as described above. At step 1504 an autocorrelation calculation is performed. Autocorrelation is a mathematical tool for finding repeating patterns, such as the presence of a periodic signal which has been buried under noise, or identifying the missing fundamental frequency in a signal implied by its harmonic frequencies. The resulting autocorrelation is examined at step 1506 to determine if any values exceed a particular threshold. If the threshold is not exceeded, the process ends.

If the threshold is exceeded, as determined at step 1506, at step 1508 the autocorrelation values that exceed the threshold are examined in order to eliminate multiple adjacent values that may be caused e.g. by particularly strong correlations and reduce those multiple adjacent values to a single value. Multiples of detected values are also eliminated to prevent redundancy, e.g. if a repeating pattern of 10 events is found, the autocorrelation will most likely also have peaks at 20, 30, 40, etc. events, but those additional peaks provide no additional useful information.

Figure 16:
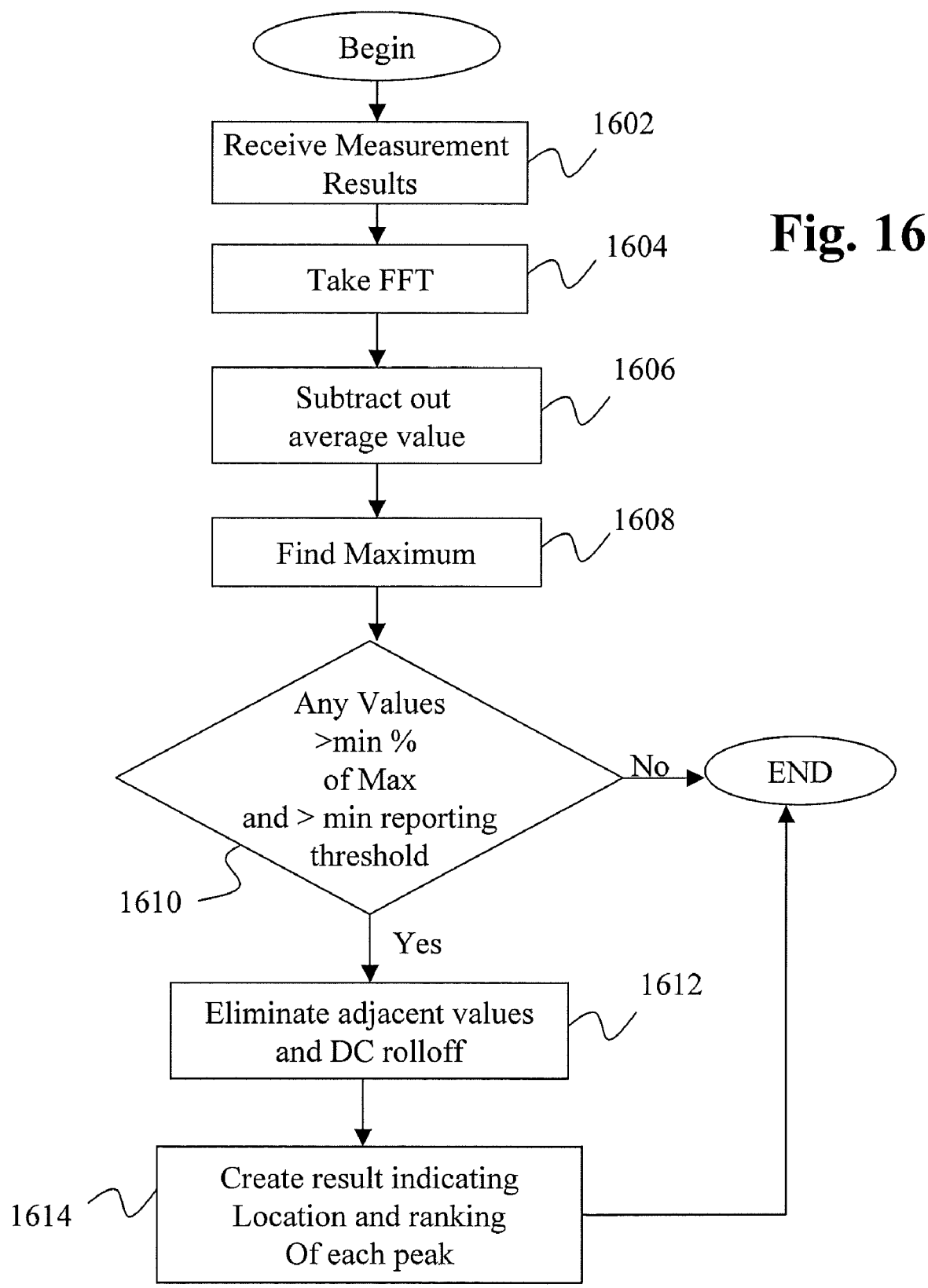
FIG. 16 shows a method of detecting peaks in a Fast Fourier Transform of a data set.

FIG. 16 shows a method of detecting peaks in a Fast Fourier Transform of a data set. At step 1602 the data set is received. This data set may be for example a measurement result or a Voltage versus Time record. The data set is subjected to a FFT at step 1604. The average value of the resultant FFT is then subtracted at step 1606 and the maximum remaining value is determined at step 1608. At step 1610, values are searched for which are greater than a particular percentage of the maximum value determined in step 1608. For example, if the maximum value was 200 psec and the threshold level was 10%, only values greater than 20 psec would be selected. The selected values are then further tested to determine if they are greater than a minimum reporting threshold of for example 1 psec. This step is performed to avoid marking inconsequential peaks in the spectrum of a very clean signal such as that produced by a high-precision pulse generator.

If no peaks are selected in step 1610, the process ends. Otherwise, the selected peaks are further tested to eliminate adjacent values such as can occur in an FFT when a large amount of energy is present at a particular frequency and some of that energy leaks into adjacent FFT values. Selected peaks that are determined to be part of the DC rolloff leakage are also eliminated at this step. In step 1614, one or more of the remaining peaks are marked. This marking may include information on the amplitude of the peak and that peak's size ranking among all peaks found.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

As described above, embodiments can be embodied in the form of computer-implemented processes and apparatuses for practicing those processes. In exemplary embodiments, the invention is embodied in computer program code executed by one or more network elements. Embodiments include computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. Embodiments include computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The invention claimed is:

1. A method implemented on a computing device for detecting waveform anomalies in an electrical waveform, the electrical waveform being composed of one or more signals and being provided to a waveform measurement device, the method comprising:
  receiving input information at the computing device created by the waveform measurement device describing one or more characteristics of the electrical waveform;
  creating on the computing device an instance of one or more agents having input requirements that are met by the characteristics described by the input information, the agents being selected from a set of predefined agents;
  analyzing the input information with one or more of the created agents; and
  notifying a user in the event that any of the created agents have detected an anomaly.

2. The method of claim 1, further comprising:
  creating multiple instances of one of the agents in the event that multiple instances of a particular data type are present in the input information.

3. The method of claim 1, further comprising:
  determining the input requirements of each agent.

4. The method of claim 1, further comprising:
  setting a flag indicating that a particular agent has detected a particular anomaly.

5. The method of claim 1, further including:
  displaying only portions of the input information that include an anomaly.

6. The method of claim 1, wherein the one or more created agents include a shelf on transition agent configured to locate transitions in the electrical waveform from a first value to a second value that include a shelf.

7. The method of claim 6, further comprising:
  creating an average low value related to the first value and an average high value related to the second value;
  setting a low value based on the average low value and high value based on the average high value;
  finding all rising edges in the input information where the electrical waveform transitions from the low value to the high value;
  finding all falling edges in the input information where the electrical waveform transitions from the high value to the low value; and
  for all rising and falling edges, calculating the mean, maximum and minimum values of the instantaneous rate of change or slope of the edge;
  for all rising and falling edges, calculating the absolute value of the difference between the mean and maximum and the absolute value of the difference between the mean and the minimum;
  for all rising and falling edges, determining whether the absolute value of the difference between the mean and the maximum exceeds the absolute value of the difference between the mean and the minimum by a specified factor or ratio; and
  marking each edge where the absolute value of the difference between the mean and the maximum exceeds the absolute value of the difference between the mean and the minimum by said factor or ratio.

8. The method of claim 7, further comprising:
  calculating the ratio of marked edges to total edges; and
  in the event the ratio exceeds a specific value, indicating that the waveform exhibits shelf behavior, otherwise, indicating that the waveform exhibits metastable behavior.

9. The method of claim 1, wherein the one or more created agents include an overshoot/undershoot/reflection/crosstalk agent configured to locate one or more of overshoot, undershoot, crosstalk or reflection in the electrical waveform.

10. The method of claim 9, wherein analyzing includes:
  calculating a highchange value, calculating including:
  creating a first value equal to the difference between a maximum value of a voltage versus time representation of the input information and a logical high value;
  creating a second value equal to the difference between the logical high value and a logical low value; and
  dividing the first value by the second value.

11. The method of claim 10, wherein analyzing further includes:
    determining that the highchange value is greater than a threshold;
    determining that the maximum value occurs directly after a rising edge; and
    marking the input information as containing overshoot.

12. The method of claim 10, wherein analyzing further includes:
    determining that the highchange value is greater than a threshold;
    determining that the maximum value does not occur directly after a rising edge;
    determining that the signal includes multiple instances where a voltage exceeds a value representing a logical one; and
    marking the information as containing reflections.

13. The method of claim 10, wherein analyzing further includes:
    determining that the highchange value is greater than a threshold;
    determining that the maximum value does not occur directly after a rising edge;
    determining that the signal does not include multiple instances where a voltage exceeds a value representing a logical one; and
    marking the input information as containing crosstalk.

14. The method of claim 9, wherein analyzing further includes
    calculating a lowchange value, calculating including:
    creating a first value equal to the difference between a logical low value and a minimum value of a voltage versus time representation of the input information;
    creating a second value equal to the difference between a logical high value and the logical low value; and
    dividing the first value by the second value; and
    determining that the lowchange value exceeds a threshold.

15. The method of claim 14, wherein analyzing further includes:
    determining that the minimum value occurs directly after a falling edge; and
    marking the input information as containing undershoot.

16. The method of claim 14, wherein analyzing further includes:
    determining that the minimum value does not occur directly after a falling edge;
    determining that the signal include multiples instances where a voltage is less than a value representing a logical zero; and
    marking the input information as having reflections.

17. The method of claim 14, wherein analyzing further includes:
    determining that the minimum value does not occur directly after a falling edge;
    determining that the signal does not include multiples instances where a voltage is less than a value representing a logical zero; and
    marking the input information as having crosstalk.

18. The method of claim 1, wherein the one or more created agents includes a parameter drift agent configured to locate parameter drift.

19. The method of claim 18, further comprising:
    in the event that the input information is in a voltage versus time format, converting the input information into a time versus time format;
    calculating a parameter of the input time versus time formatted input information;
    determining that the parameter has changed over time; and
    marking the information as containing parameter drift.

20. The method of claim 18, wherein the analysis is performed over multiple sets of input information.

21. The method of claim 18, wherein the analysis is performed over a single set of input information that has been divided into multiple segments.

22. The method of claim 1, further comprising:
    presenting to a user a link to explanatory information about one or more detected anomalies.

23. The method of claim 22, wherein the explanatory information is stored at a location remote from the computing device.

24. The method of claim 22, wherein the explanatory information is compiled by one or more other users.

25. The method of claim 1, wherein the analyzing step includes a meta-analysis of all detected anomalies prior to notifying the user.

26. The method of claim 25, wherein the meta-analysis includes detecting and removing duplicate notifications.

27. The method of claim 25, wherein the meta-analysis includes replacing groups of notifications with a single, different notification.

28. The method of claim 25, further comprising:
    analyzing notifications based on degree of activation; and
    searching for closely matching records in a database of waveform behaviors.

29. The method of claim 1, wherein the input information is in a time-versus-time format.

30. The method of claim 1, wherein the input information is in a voltage-versus-time format.

31. The method of claim 1, wherein the input information is live information.

32. The method of claim 1, wherein the input information is saved information.

33. A method of detecting anomalies in information describing an electrical waveform created in an electrical circuit, the information being created from readings made by an oscilloscope, the method comprising:
    coupling one or more signals read by the oscilloscope to a computing device;
    determining, at the computing device, characteristics of the one or more signals;
    selecting an anomaly agent from a set of anomaly agents defined on the computing device, selecting including matching the characteristics to operating requirements of the agent;
    creating an instance of the anomaly detection agent; and
    notifying a user of the detection of an anomaly.

34. The method of claim 33, wherein the anomoly agent is a named-signal recognition agent configured to automatically recognize a one of the one or more input signals as belonging to a particular named-signal.

35. The method of claim 34, further comprising:
    performing additional tests on the one of the one or more input signals to determine if it complies to a named-signal standard specification; and
    notifying the user of the result of the additional tests.

* * * * *